(12) United States Patent
Hwang (10) Patent No.: US 7,668,014 B2
(45) Date of Patent: Feb. 23, 2010

(54) NON-VOLATILE MEMORY DEVICE AND PROGRAM METHOD

(75) Inventor: Sang-Won Hwang, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 107 days.

(21) Appl. No.: 12/106,472

(22) Filed: Apr. 21, 2008

(65) Prior Publication Data

US 2008/0266951 A1 Oct. 30, 2008

(30) Foreign Application Priority Data

Apr. 24, 2007 (KR) ...................... 10-2007-0039873

(51) Int. Cl.
*G11C 16/04* (2006.01)
(52) U.S. Cl. ............................ 365/185.18; 365/185.17; 365/185.28
(58) Field of Classification Search ............ 365/185.17, 365/185.18, 185.23, 185.25, 185.27, 185.28
See application file for complete search history.

(56) References Cited

U.S. PATENT DOCUMENTS

| | | | | |
|---|---|---|---|---|
| 5,748,531 A | * | 5/1998 | Choi ...................... | 365/185.18 |
| 6,236,594 B1 | * | 5/2001 | Kwon ..................... | 365/185.11 |
| 6,958,936 B2 | * | 10/2005 | Quader et al. .......... | 365/185.17 |
| 7,292,476 B2 | * | 11/2007 | Goda et al. ............ | 365/185.17 |
| 2009/0135656 A1 | * | 5/2009 | Park ...................... | 365/185.19 |

FOREIGN PATENT DOCUMENTS

| | | |
|---|---|---|
| JP | 11086543 A | 3/1999 |
| KR | 100142368 B1 | 3/1998 |
| KR | 100300031 B1 | 6/2001 |
| KR | 1020030056185 A | 7/2003 |
| KR | 1020040036015 A | 4/2004 |
| KR | 1020050109835 A | 11/2005 |
| KR | 1020060107697 A | 10/2006 |

* cited by examiner

*Primary Examiner*—Gene N. Auduong
(74) *Attorney, Agent, or Firm*—Volentine & Whitt, PLLC (57) ABSTRACT

A non-volatile memory device, related memory system, and program method for the non-volatile memory device are disclosed. In the method, memory cells in a memory cell array are accessed through a plurality of word lines by applying a program voltage to a selected word line, wherein the selected word line is not adjacent to an outmost word line, applying a first reduced pass voltage to word lines adjacent to the selected word line, and applying a second reduced pass voltage to the outermost word lines.

13 Claims, 5 Drawing Sheets

NON-VOLATILE MEMORY DEVICE AND PROGRAM METHOD

CROSS-REFERENCE TO RELATED APPLICATIONS

This U.S. non-provisional patent application claims priority under 35 U.S.C. § 119 to Korean Patent Application No. 10-2007-0039873 filed on Apr. 24, 2007, the subject matter of which is hereby incorporated by reference.

BACKGROUND OF THE INVENTION

The present invention relates to a semiconductor memory device and more particularly to a flash memory device.

Semiconductor memories are vital components in digital logic systems, such as computers and consumer electronics. Therefore, advances in the fabrication of semiconductor memories including process enhancements and technology developments through device scaling to higher densities and faster operating speeds improve the overall performance of digital logic systems.

Semiconductor memory devices may be characterized as volatile memory devices, such as Random Access Memory (RAM) devices, or non-volatile memory devices. In RAM devices, digital data is stored by either setting up the logic state of a bi-stable flip-flop in the case of static random access memory (SRAM) devices, or by charging/discharging a capacitor in the case of a dynamic random access memory (DRAM) device. In either case, the data is retained in memory only so long as the power is applied to the device. However, once power is no longer applied, stored data is lost from volatile memories.

In contrast, Non-volatile memories, such as Mask Read-Only Memory (MROM), Programmable Read-Only Memory (PROM), Erasable Programmable Read-Only Memory (EPROM), and Electrically Erasable Programmable Read-Only Memory (EEPROM), are capable of maintaining stored data in the absence of applied power. The non-volatile memory data storage mode may be permanent or reprogrammable depending upon the fabrication technology used to implement the device.

A combination of volatile and non-volatile operating modes are available in certain hybrid devices such as the non-volatile SRAM (nvSRAM). These memory devices are particularly well suited for use in systems that require a fast, programmable, non-volatile data storage capability. In addition, dozens of special memory architectures have evolved which contain some additional logic circuitry to optimize their performance of memory devices for application-specific tasks.

The incorporation and use of MROM, PROM, and EPROM devices in contemporary applications have proved difficult given the unique conditions necessary to erase and/or data within these devices. On the other hand, the EEPROM is capable of being electrically erased or written to, and as such has been successfully incorporated into many products. Indeed, the application of EEPROMs (e.g., flash memory) has widened recently to include auxiliary memories or system programming memories requiring continuous updates. In particular, so-called flash memory exhibits a higher degree of integration than other types of EEPROM and is thus advantageous in the implementation of large auxiliary memories.

SUMMARY OF THE INVENTION

Embodiments of the invention provide a flash memory device and operation method capable of improving a pass voltage window. Embodiments of the invention also provide a flash memory device capable of varying a pass voltage based on the relative physical position of a selected word line.

In one embodiment, the invention provides a program method for a flash memory device comprising a memory cell array having memory cells accessed through a plurality of word lines and bit lines, comprising; applying a program voltage to a selected word line in the plurality of word lines, wherein the selected word line is not adjacent to an outmost word line in the plurality of word lines, applying a first reduced pass voltage to word lines in the plurality of word lines adjacent to the selected word line, and applying a second reduced pass voltage to the outermost word lines.

In another embodiment, the invention provides a program method for a flash memory device comprising a memory cell array having memory cells accessed through a plurality of word lines and bit lines, comprising; applying a program voltage to a selected word line in the plurality of word lines, if the selected word line is not adjacent to first and second outermost word line in the plurality of word lines, applying a first reduced pass voltage to word lines in the plurality of word lines adjacent to the selected word line, and applying a second reduced pass voltage to the outermost word lines, but if the selected word line is adjacent to the first outermost word line, applying a third reduced pass voltage to the first outermost word line, applying the first reduced pass voltage to a word line adjacent to the selected word line and opposite the first outermost word line, and applying the second reduced pass voltage to the second outermost word line, wherein the third reduced pass voltage is less than the second reduced pass voltage which is less than the first reduced pass voltage.

In another embodiment, the invention provides a flash memory device comprising; a memory cell array comprising a string of non-volatile memory cells series connected between a select transistor connected to a string select line and a ground select transistor connected to a ground select line, wherein each one of the memory cells is respectively connected to a word line arranged in a plurality of word lines, wherein the plurality of word lines comprises a first outermost word line and a second outermost word line, a word line voltage generator configured to generate a program voltage, a pass voltage, a first reduced pass voltage, a second reduced pass voltage, and a third reduced pass voltage, a row decoder circuit receiving the program voltage, pass voltage, first reduced pass voltage, second reduced pass voltage, and third reduced pass voltage from the word line voltage generator, and control logic configured to control the row decoder circuit such that during a program operation the program voltage is applied to a selected word line, and if the selected word line is not adjacent to first and second outermost word lines, a first reduced pass voltage is applied to word lines adjacent to the selected word line, and a second reduced pass voltage is applied to the first and second outermost word lines, but if the selected word line is adjacent to the first outermost word line, a third reduced pass voltage is applied to the first outermost word line, the first reduced pass voltage is applied to a word line adjacent to the selected word line and opposite the first outermost word line, and the second reduced pass voltage is applied to the second outermost word line, wherein the third reduced pass voltage is less than the second reduced pass voltage which is less than the first reduced pass voltage.

In another embodiment, the invention provides a memory card comprising a flash memory device such set forth above and a memory controller configured to control the flash memory device.

BRIEF DESCRIPTION OF THE DRAWINGS

FIG. 3, including

DESCRIPTION OF EMBODIMENTS

Embodiments of the invention will now be described with reference to the accompanying drawings. The present invention may, however, be embodied in different forms and should not be constructed as being limited to only the illustrated embodiments. Rather, these embodiments are presented as teaching examples.

Within contemporary flash memory devices, the distance between a string select line SSL and an adjacent word line (i.e., a first outermost word line in a plurality of word lines within a memory cell array) is generally greater than the distance between adjacent word lines in the plurality of word lines. Likewise, the distance between a ground select line GSL and an adjacent word line (i.e., a second outermost word line in a plurality of word lines opposite the first outermost word line) is also greater than the distance between adjacent word lines in the plurality of word lines. This configuration results in an increased coupling ratio for each one of the first and second outermost word lines. This increase in coupling ratio for the two outermost word lines in the plurality of word lines has material effects related to a pass voltage applied to these word lines. For example, if the pass voltage is relatively high, the channel voltage for a string of memory cells including a program-inhibited memory cell may be boosted high while one or more memory cells in the string suffer from a conventionally understood phenomenon referred to as "soft programming". Accordingly, the characteristics of a pass voltage must be determined after considering its likely channel boosting effect and related programming characteristics.

In accordance with a flash memory device consistent with an embodiment of the invention, a pass voltage applied to an unselected word line in the plurality of word lines may be determined based on its relative physical location or position within the plurality of word lines, and/or the location of a selected word line in the plurality of word lines. In the discussion that follows, the symbol "VPASS" will be used to indicate a pass voltage having a level determined in relation to the position of the word line and the relative position of a selected word line.

In one embodiment of the invention, an adjacent word line to a selected word line is supplied with a first reduced pass voltage (hereinafter, VPASS1) reduced by $\Delta V1$ from a defined pass voltage VPASS. Each of the outermost word lines in the plurality of word lines is supplied with a second reduced pass voltage (hereinafter, VPASS2) reduced by $\Delta V2$ from the pass voltage VPASS. In a case where a program voltage is supplied to a word line adjacent to an outermost word line (i.e., the word line adjacent to the outermost word line is a selected word line), the outermost word line is supplied with a third reduced pass voltage (hereinafter, VPASS3) reduced by $\Delta V3$ from the pass voltage VPASS, and a word line adjacent (on the other side from the outermost word line) to the selected word line is supplied with the first reduced pass voltage VPASS1. In the foregoing, $\Delta V2$ is set to be greater than $\Delta V1$ but less than $\Delta V3$, thereby establishing a relative pass voltage reduction relationship of ($\Delta V1 < \Delta V2 < \Delta V3$).

The foregoing application of different pass voltages to various word lines in relation to their absolute position within the plurality of word lines (e.g., an outermost position) and their relative position to a selected word line establishes a useful word line bias condition. In accordance with this bias condition, it is possible to generally and accurately determine a pass voltage window regardless of variations in the coupling ratio between different word lines and associated string select and ground select lines. This enhanced determination ability allows overall channel boosting efficiency and programming characteristics to be improved, as will be described in some additional detail below.

Figure 1:
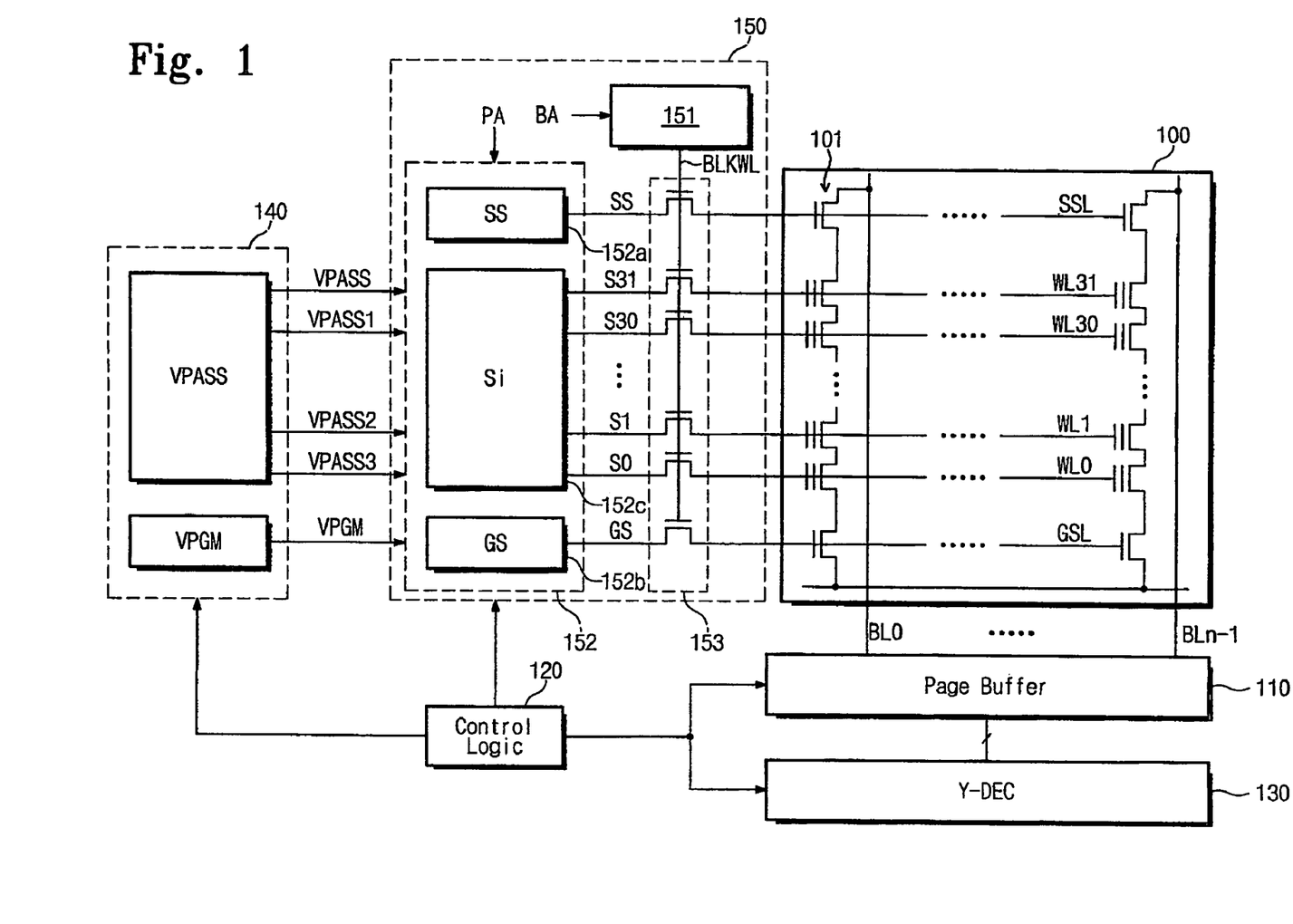
FIG. 1 is a block diagram of a flash memory device according to an embodiment of the invention.

FIG. 1 is a block diagram of a flash memory device according to an embodiment of the invention. The embodiment illustrated in FIG. 1 is a NAND flash memory device, but the dictates and resulting benefits of the present invention may be readily extrapolated by those skilled in the art to other types of memory devices such as MROM, PROM, FRAM, CTF flash memory, NOR flash, and the like.

Referring to FIG. 1, the NAND flash memory device comprises a memory cell array 100 implemented in conventional fashion with memory cell capable of storing N bits of data per memory cell, where N is a positive integer. As desired for specific implementations, memory cell array 100 may be further organized into a plurality of memory blocks. For convenience of description, only the single memory block illustrated in FIG. 1 will be discussed. Thus, memory block 100 comprises a plurality of strings 101 each respectively connected to one of a plurality of bit lines BL0 to BLm−1.

Each string 101 comprises (an upper) string select transistor, (a lower) ground select transistor, and a plurality of memory cells serially connected between these select transistors. The string select transistor is controlled by a string select line SSL, and the ground select transistor is controlled by a ground select line GSL. Each one of the plurality of memory cells is respectively controlled by a corresponding word lines WL0 to WL31. The bit lines BL0 to BLm−1 are connected to a page buffer circuit 110, which is controlled by control logic 120 and operates as a write driver circuit or a sense amplifier circuit depending on operating mode. For example, page buffer circuit 110 may operate as a write driver circuit during program operations and as a sense amplifier circuit during read operations. Although not shown in figures, page buffer circuit 110 may include individual page buffers connected to respective bit lines BL0 to BLm−1 or to respective bit line pairs. A column decoder circuit 130 may be controlled by control logic 120 to provide a data transfer path between page buffer circuit 110 and an external data destination (e.g., a memory controller).

Continuing with FIG. 1, the flash memory device further comprises a word line voltage generator circuit 140 and a row decoder circuit 150. Word line voltage generator circuit 140 may be controlled by control logic 120 to generate various word line voltages (e.g., a program voltage, a pass voltage, a read voltage, and the like) required to execute program/read operations in the flash memory device. In the illustrated embodiment, word line voltage generator circuit 140 comprises a program voltage generator 141 and a pass voltage generator 142. Program voltage generator 141 may be used to conventionally generate the program voltage supplied to a selected word line during a program operation. Pass voltage generator 142 may be used to generate the plurality of pass voltages (e.g., VPASS, VPASS1, VPASS2, and VPASS3) variously supplied to unselected word lines during a program operation. The program and pass voltages VPGM, VPASS, VPASS1, VPASS2 and VPASS3 may be supplied to word lines traversing memory 100 through row decoder circuit 150. Consistent with the foregoing discussion, VPASS is greater than VPASS1 by $\Delta V1$, greater than VPASS2 by $\Delta V2$, and greater than VPASS3 by $\Delta V3$.

Those skilled in the art will recognize that the functionally conceptually illustrated above in relation to program voltage generator 141 and pass voltage generator 142 may be implemented in many different circuits. For example, it is not necessary for the functionality of program voltage generator 141 and pass voltage generator 142 to be implemented as separate (or independent) circuits.

Row decoder circuit 150 may be controlled by control logic 120 to drive selected and unselected word lines with corresponding word line voltages (e.g., a program voltage and a selected pass voltage), respectively. In the illustrated embodiment, row decoder circuit 150 comprises a first decoding and driving block 151, a second decoding and driving block 152, and a switch block 153. First decoding and driving block 151 may drive a block word line BLKWL with a high voltage (e.g., a voltage higher than the program voltage) in response to a block address BA. Second decoding and driving block 152 may include a first driver SS or 152a, a second driver GS or 152b, and a third driver Si or 152c. First driver 152a may be configured to drive a signal line SS corresponding to a string select line SSL with a power supply voltage or a ground voltage. Second driver 152b may drive a signal line GS corresponding to a ground select line GSL with a power supply voltage or a ground voltage. Third driver 152c may drive signal lines S0 to S31 corresponding to word lines WL0 to WL31 with corresponding word line voltages (e.g., a program voltage, a selected pass voltage, a read voltage, etc.) in response to a page address PA.

Switch block 153 may be controlled by the block word line BLKWL and electrically connect outputs SS, S31 to S0 and GS with corresponding word lines and select lines. The transistors forming switch block 153 may be high-voltage tolerant in a manner well understood in the art.

In a flash memory device consistent with an embodiment of the invention, when a program operation is carried out, the word line adjacent to a selected word line may be supplied with the first reduced pass voltage VPASS1. In a case where the selected word line is not adjacent to an outermost word line (i.e., WL0 and WL31 in the illustrated example), the second reduced pass voltage VPASS2 is applied to the outermost word lines WL0 and WL31, respectively. On the other hand, in a case where the program voltage Vpgm is applied to a word line (e.g., WL1 or WL30) adjacent to one of the outermost word lines WL0 and WL31 (i.e., when either word line WL1 or WL30 is selected), the third reduced pass voltage VPASS3 is applied to the outermost word line WL0 or WL31, and the first reduced pass voltage VPASS1 is applied to an opposing word line adjacent to the selected word line. Otherwise, the remaining word lines in the plurality of word lines are driven with the pass voltage VPASS.

As is understood by those skilled in the art, one problem may arise when programming selected memory cells connected to a selected word line with unselected memory cells connected to the selected word line which are so-called "program-inhibited." When the program voltage is applied to the selected word line, it is not only applied to the selected memory cell(s) but also to the unselected memory cells (i.e., program-inhibited memory cells) arranged along the same selected word line. In this case, there may be programmed unselected memory cells connected to the selected word line. Unintended programming of unselected memory cells connected to a selected word line is referred to a program disturb (or disturbance) event. On the other hand, unselected memory cells can be programmed by a pass voltage applied to unselected word lines. Unintended programming of unselected memory cells connected to an unselected word line is referred to as a pass voltage disturb (or disturbance) event.

Program disturb and pass voltage disturb events are more fully disclosed, for example, in U.S. Pat. Nos. 5,715,194; 6,061,270; 6,661,707; and 7,031,190, the collective subject matter of which is hereby incorporated by reference.

Figure 2:
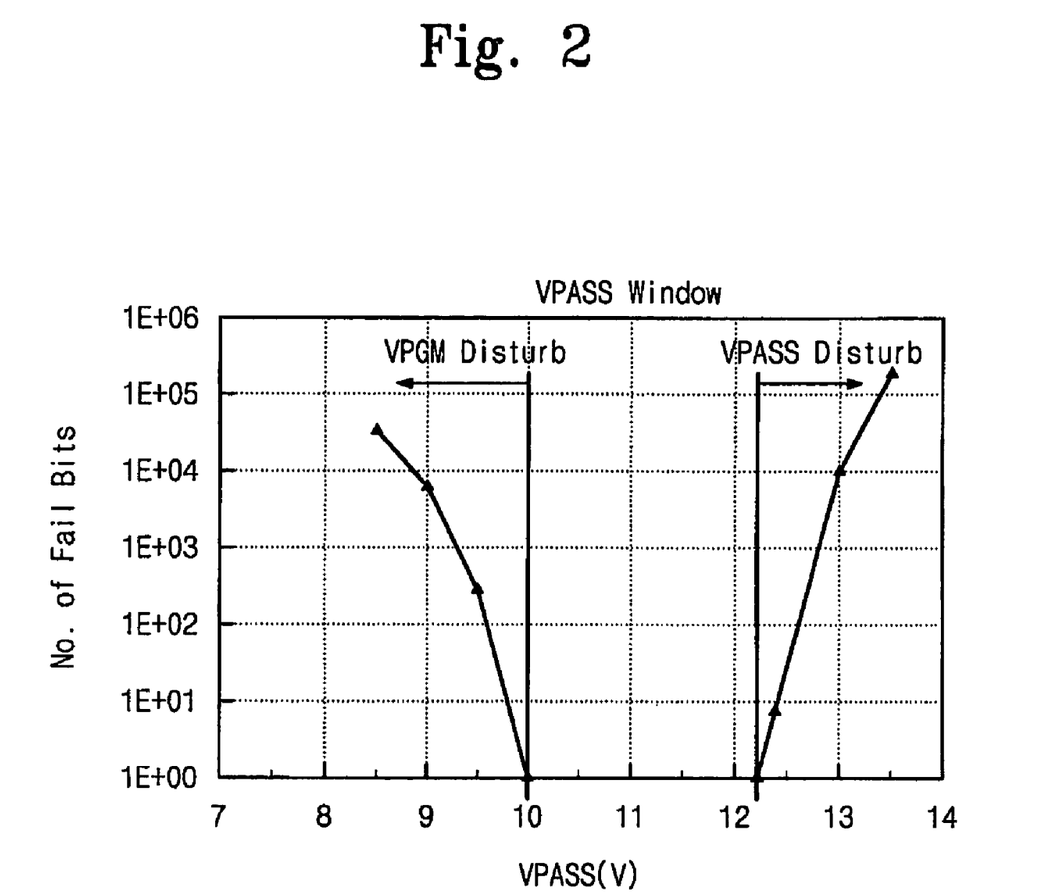
FIG. 2 is a voltage verse bit failure diagram further describing a pass voltage window in the context of the present invention.

There exists the following relationship between position of a program-inhibited memory cell and an applied pass voltage. As illustrated in FIG. 2, if a pass voltage is relatively low, a program preventing effect may be obtained with respect to a program disturb, while program-inhibited memory cells can be unnecessarily soft programmed due to the program disturb. In other words, in a case where a pass voltage is relatively low, since a channel voltage of a program-inhibited memory cell is not boosted to a desired voltage level, the program-inhibited memory cell can be inadvertently programmed.

In a case where a pass voltage is relatively high, a program preventing effect may be obtained with respect to program-inhibited memory cells, while program-inhibited memory cells can be unnecessarily programmed due to pass voltage disturb. In other words, if a pass voltage is relatively high, program-inhibited memory cells may be programmed due to the pass voltage. Accordingly, it is important to appropriately determine a pass voltage range considering the above-described relationship. This pass voltage range is referred to as a pass voltage window.

A pass voltage may be set to a voltage in the pass voltage window in consideration of possible program disturb and pass voltage disturb events. The following problem may arise due to a pass voltage that is determined in the above-described manner.

As is well appreciated in the art, the typical distance between a string select line and an adjacent outermost word line is greater than that between adjacent word lines in the plurality of word lines. Thus the coupling ratio between the floating gate of a memory cell corresponding to the outermost word line is relatively increased. Thus, when a pass voltage is applied to the outermost word line, a voltage induced at a floating gate of a corresponding memory cell connected to the outermost word line may be higher than a voltage induced at a floating gate of a corresponding memory cell for each of the remaining word lines. For this reason, an increase in the pass voltage may be limited in relation to the outermost word line. For example, when a pass voltage is defined as 10V, the voltage induced at a floating gate of a memory cell connected to the outermost word line may be higher than the voltage induced at a floating gate of a memory cell connected to the remaining word lines. In this case, a program-inhibited memory cell supplied with the pass voltage may be soft programmed. In response to this potential outcome, the pass voltage may be limited to a relatively lower voltage level.

Since the pass voltage is limited to a relatively lower voltage, its corresponding channel boosting efficiency is reduced. This means that a program characteristic, (i.e., the program inhibition characteristic) is reduced.

Figure 3A:
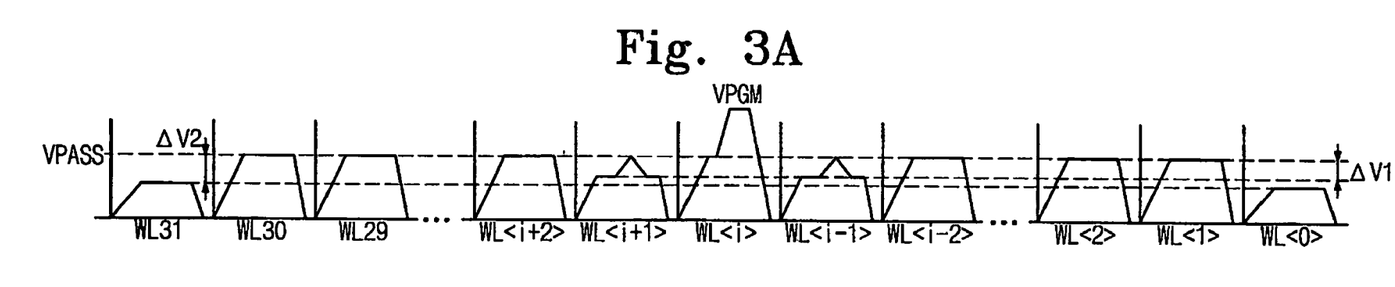
FIGS. 3A through 3C, is a collection of voltage waveform diagrams showing a word line bias condition during programming operation for a flash memory device according to an embodiment of the invention.
Figure 3B:
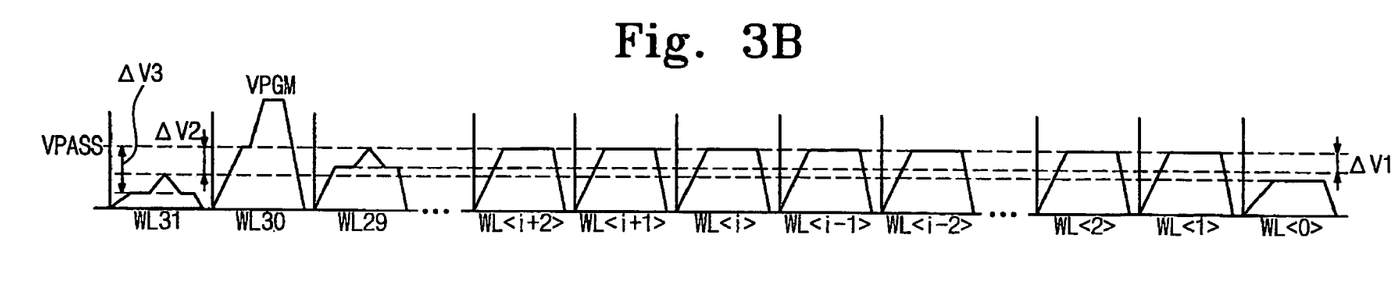
Figure 3C:
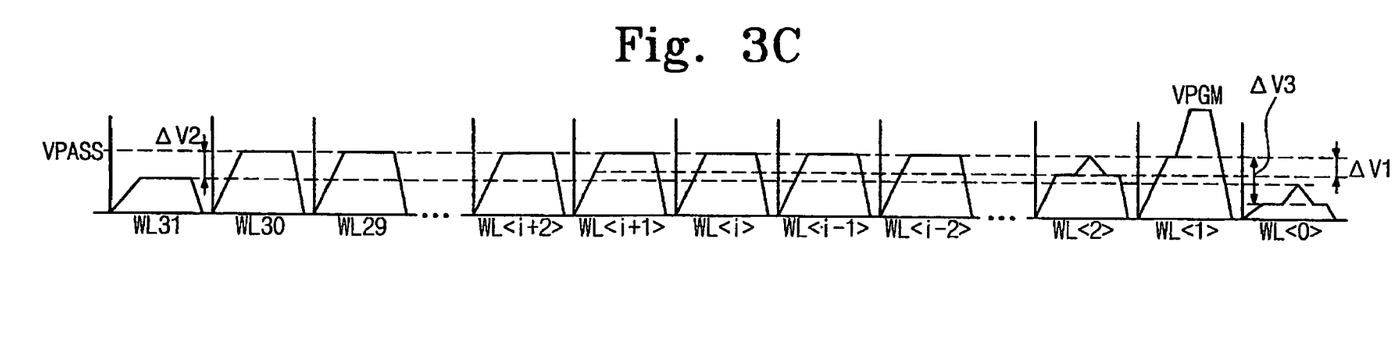

In order to overcome the above-described problem, as illustrated in FIG. 3A, in a case where a program operation is carried out in an embodiment of the present invention, the first reduced pass voltage VPASS1 is supplied to word lines WLi−1 and WLi+1 adjacent to a selected word line WLi. At this time, the outermost word lines WL0 and WL31 are supplied with the second reduced pass voltage VPASS2. Herein, the second reduced pass voltage VPASS2 may be determined in relation to an understood coupling ratio. Although the second reduced pass voltage VPASS2 is applied to the outermost word lines WL0 and WL31, the channel voltage of the string supplied with the power supply voltage via a corresponding bit line will be sufficiently boosted by a relatively large coupling ratio. On the other hand, as illustrated in FIGS. 3B and 3C, in cases where the program voltage Vpgm is applied to either word line WL1 or WL30 adjacent to an outermost word line WL0 or WL31, (i.e., when either word line WL1 or WL30 is selected), the third reduced pass voltage VPASS3 is supplied to the adjacent outermost word line WL0 or WL31, and the first reduced pass voltage VPASS1 is supplied to either word line WL2 or WL29 adjacent to the selected word line WL0 or WL31. The remaining word lines may be driven with the pass voltage VPASS.

Figure 4:
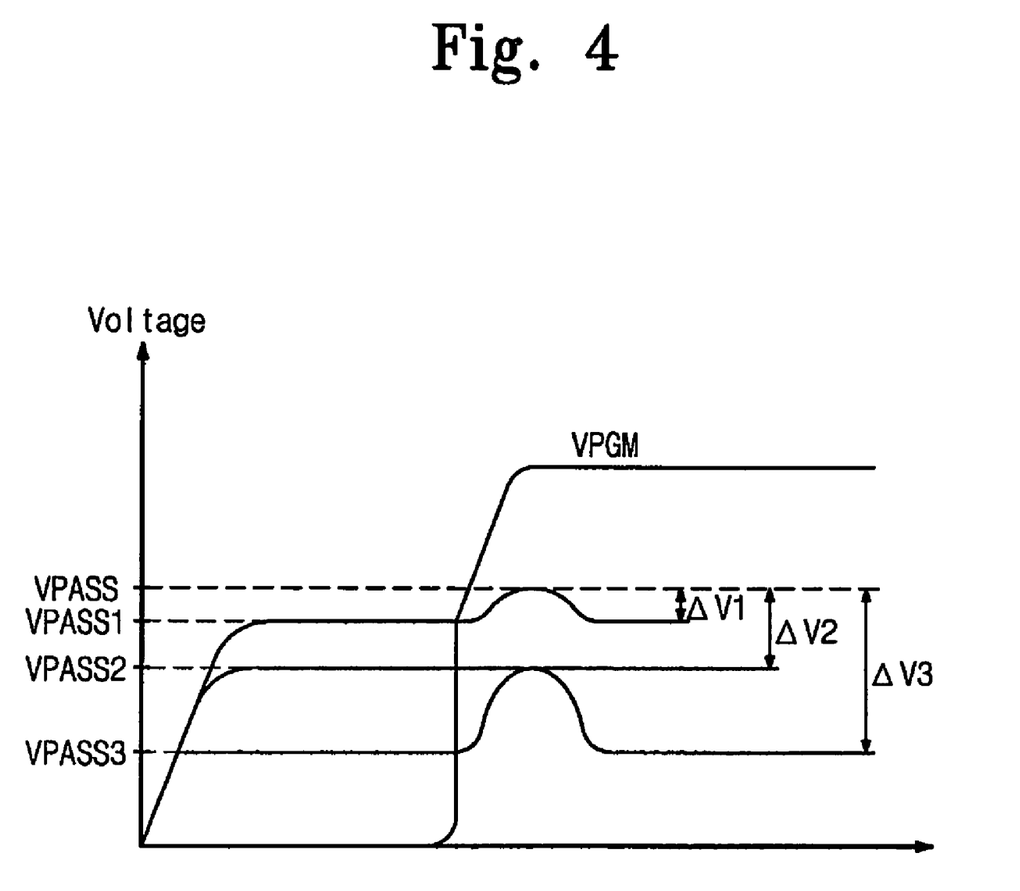
FIG. 4 is a diagram showing pass voltage variation for a programming operation of a flash memory device according to an embodiment of the invention.

In accordance with these bias conditions, as illustrated in FIG. 4, the voltage applied to each word line will not undesirably increase above the pass voltage VPASS. In other words, since the pass voltage is not limited by the effects associated with the position of selected verses unselected word lines, it is possible to increase the maximum level of the pass voltage. That is, it is possible to establish a relatively wide pass voltage window. This is advantageous in the resulting channel boosting efficiency and program characteristic(s) are improved relative to the program disturb and pass voltage disturb events.

As noted above, flash memory devices are increasingly used in many host devices, including as selected examples, portable electronics such as cellular phones, personal digital assistants (PDA), digital cameras, portable gaming consoles, MP3 players, etc. Within such devices, flash memory is used to store programming code and payload data (music files, video files, etc.). Additionally, flash memory is also to be used with increasing regularity in home applications such as high-definition TVs, digital versatile disks (DVDs), routers, and global positioning systems (GPSs), etc.

Figure 5:
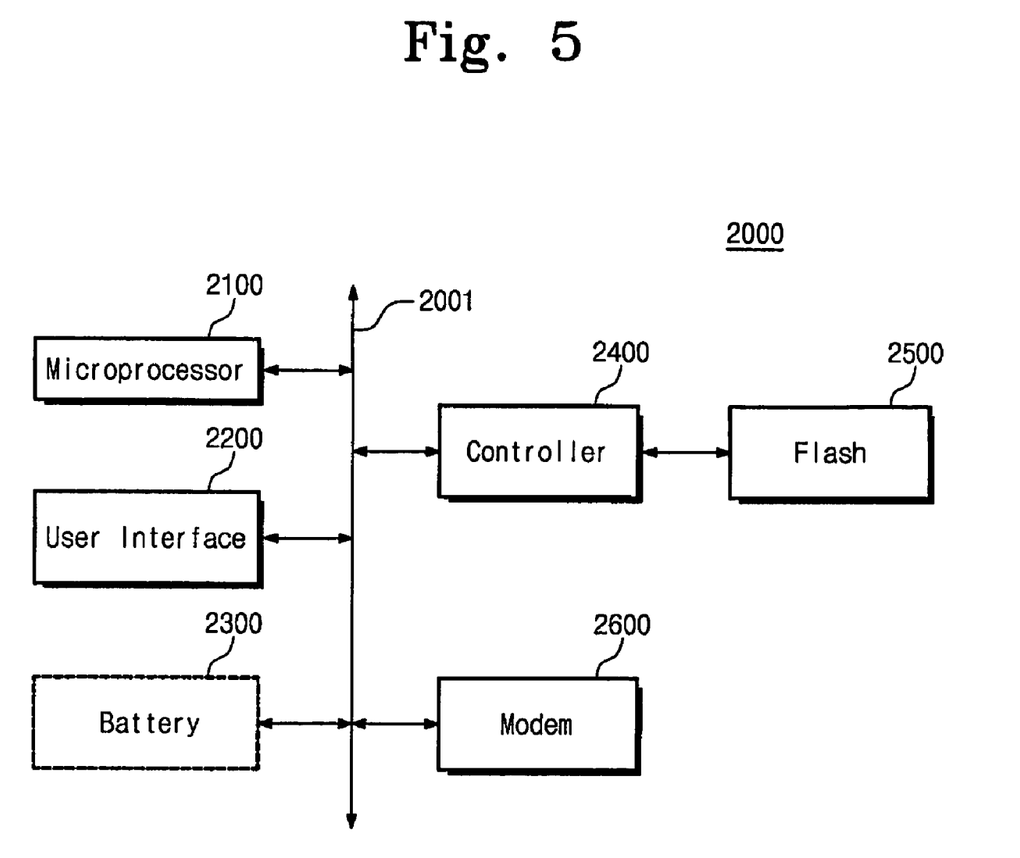
FIG. 5 is a general block diagram showing a computational system incorporating a flash memory device according to an embodiment of the invention.

FIG. 5 is a block diagram of a general computational system 2000 including one or more flash memory device(s) consistent with an embodiment of the invention. Computational system 2000 comprises a microprocessor 2100, a user interface 2200, a memory controller 2400, a flash memory device 2500, and a modem 2600 such as a baseband chipset, which are connected via a bus 2001. Flash memory device 2500 may be configured in a manner consistent with the embodiment shown in FIG. 1. Flash memory device 2500 may store N-bit data, where N is a positive integer, to be processed by microprocessor 2100, as provided by memory controller 2400. If computational system 2000 shown in FIG. 5 is a mobile apparatus, a battery 2300 may be further provided to supply an operating voltage. Although not shown in FIG. 5, computational system 2000 may further comprise an application chipset, a camera image processor (e.g., CMOS image sensor; CIS), mobile DRAM, etc. In certain computational systems, flash memory device 2500 and memory controller 2400 may be conventionally configured as a memory card. Further, flash memory device 2500 and memory controller 2400 may be configured as a OneNAND™ flash memory device.

The above-disclosed subject matter is to be considered illustrative, and not restrictive, and the appended claims are intended to cover all such modifications, enhancements, and other embodiments, which fall within the true scope of the invention. Thus, to the maximum extent allowed by law, the scope of the present invention is to be determined by the broadest permissible interpretation of the following claims and their equivalents.

What is claimed is:

1. A program method for a non-volatile memory device comprising a memory cell array having memory cells accessed through a plurality of word lines and bit lines, comprising:
   applying a program voltage to a selected word line in the plurality of word lines, wherein the selected word line is not adjacent to an outmost word line in the plurality of word lines;
   applying a first reduced pass voltage to word lines in the plurality of word lines adjacent to the selected word line; and
   applying a second reduced pass voltage to the outermost word lines.

2. The program method of claim 1, further comprising:
   applying a pass voltage to word lines in the plurality of word lines other than the selected word line, the word lines adjacent to the selected word line, and the outermost word lines, wherein the pass voltage is less than the program voltage and greater than the first reduced pass voltage.

3. The program method of claim 1, wherein the second reduced pass voltage is less than the first reduced pass voltage.

4. The program method of claim 1, wherein the outermost word lines are respectively adjacent to a string select line and a ground select line.

5. The program method of claim 1, wherein the flash memory device is a NAND flash memory device.

6. A program method for a non-volatile memory device comprising a memory cell array having memory cells accessed through a plurality of word lines and bit lines, comprising:
   applying a program voltage to a selected word line in the plurality of word lines;
   if the selected word line is not adjacent to first and second outermost word line in the plurality of word lines, applying a first reduced pass voltage to word lines in the plurality of word lines adjacent to the selected word line, and applying a second reduced pass voltage to the outermost word lines; but
   if the selected word line is adjacent to the first outermost word line, applying a third reduced pass voltage to the first outermost word line, applying the first reduced pass voltage to a word line adjacent to the selected word line and opposite the first outermost word line, and applying the second reduced pass voltage to the second outermost word line,
   wherein the third reduced pass voltage is less than the second reduced pass voltage which is less than the first reduced pass voltage.

7. The program method of claim 6, further comprising:
   applying a pass voltage to word lines in the plurality of word lines other than the selected word line, the word line adjacent to the selected word line, and the first and second outermost word lines, wherein the pass voltage is less than the program voltage and greater than the first reduced pass voltage.

8. The program method of claim 7, wherein the outermost word lines are respectively adjacent to a string select line and a ground select line.

9. A non-volatile memory device comprising:
a memory cell array comprising a string of non-volatile memory cells series connected between a select transistor connected to a string select line and a ground select transistor connected to a ground select line, wherein each one of the memory cells is respectively connected to a word line arranged in a plurality of word lines, wherein the plurality of word lines comprises a first outermost word line and a second outermost word line;
a word line voltage generator configured to generate a program voltage, a pass voltage, a first reduced pass voltage, a second reduced pass voltage, and a third reduced pass voltage;
a row decoder circuit receiving the program voltage, pass voltage, first reduced pass voltage, second reduced pass voltage, and third reduced pass voltage from the word line voltage generator; and
control logic configured to control the row decoder circuit such that during a program operation the program voltage is applied to a selected word line, and if
the selected word line is not adjacent to first and second outermost word lines, a first reduced pass voltage is applied to word lines adjacent to the selected word line, and a second reduced pass voltage is applied to the first and second outermost word lines; but if
the selected word line is adjacent to the first outermost word line, a third reduced pass voltage is applied to the first outermost word line, the first reduced pass voltage is applied to a word line adjacent to the selected word line and opposite the first outermost word line, and the second reduced pass voltage is applied to the second outermost word line,
wherein the third reduced pass voltage is less than the second reduced pass voltage which is less than the first reduced pass voltage.

10. The flash memory device of claim 9, wherein the control logic is further configured to control the row decoder to apply the pass voltage to word lines in the plurality of words lines other than the selected word line, the first and second outermost word lines, and one or more word lines adjacent to the selected word line.

11. The flash memory device of claim 10, wherein the first and second outermost word lines are respectively adjacent to the string select line and the ground select line.

12. The flash memory device of claim 7, wherein the second pass voltage is lower than the first pass voltage.

13. A memory card comprising:
a flash memory device and a memory controller configured to control the flash memory device, wherein the flash memory device comprises:
a memory cell array comprising a string of non-volatile memory cells series connected between a select transistor connected to a string select line and a ground select transistor connected to a ground select line, wherein each one of the memory cells is respectively connected to a word line arranged in a plurality of word lines, wherein the plurality of word lines comprises a first outermost word line and a second outermost word line;
a word line voltage generator configured to generate a program voltage, a pass voltage, a first reduced pass voltage, a second reduced pass voltage, and a third reduced pass voltage;
a row decoder circuit receiving the program voltage, pass voltage, first reduced pass voltage, second reduced pass voltage, and third reduced pass voltage from the word line voltage generator; and
control logic configured to control the row decoder circuit such that during a program operation the program voltage is applied to a selected word line, and if the selected word line is not adjacent to first and second outermost word lines, a first reduced pass voltage is applied to word lines adjacent to the selected word line, and a second reduced pass voltage is applied to the first and second outermost word lines, but if the selected word line is adjacent to the first outermost word line, a third reduced pass voltage is applied to the first outermost word line, the first reduced pass voltage is applied to a word line adjacent to the selected word line and opposite the first outermost word line, and the second reduced pass voltage is applied to the second outermost word line, wherein the third reduced pass voltage is less than the second reduced pass voltage which is less than the first reduced pass voltage.

* * * * *